(12) United States Patent
Choi et al.

(10) Patent No.: US 6,462,331 B1
(45) Date of Patent: Oct. 8, 2002

(54) METHOD FOR MONITORING TURBO PUMP OPERATION IN AN ION IMPLANTATION APPARATUS

(75) Inventors: Sun-Bong Choi; Dong-Ha Lim; Hyo-Sang Jung; Sung-Kyu Han, all of Kyunggi-do (KR)

(73) Assignee: Samsung Electronics Co., Ltd., Kyunggi-Do (KR)

( * ) Notice: Subject to any disclaimer, the term of this patent is extended or adjusted under 35 U.S.C. 154(b) by 0 days.

(21) Appl. No.: 09/318,409

(22) Filed: May 25, 1999

(51) Int. Cl.[7] .............................................. H01J 37/317
(52) U.S. Cl. .................................. 250/251; 250/492.21
(58) Field of Search ........................... 250/251, 492.21, 250/289

(56) References Cited

U.S. PATENT DOCUMENTS

| | | | |
|---|---|---|---|
| 3,353,107 A | 11/1967 | Graaff | 328/233 |
| 4,018,241 A | * 4/1977 | Sodal et al. | |
| 4,980,556 A | 12/1990 | O'Connor et al. | 250/423 |
| 5,300,891 A | 4/1994 | Tokoro | 328/233 |
| 5,672,882 A | * 9/1997 | Day et al. | |
| 5,959,305 A | * 9/1999 | Mack et al. | |
| 6,110,322 A | * 8/2000 | Teoh et al. | 156/345 |
| 6,114,694 A | * 9/2000 | Ito | |

* cited by examiner

Primary Examiner—Kiet T. Nguyen
(74) Attorney, Agent, or Firm—Skjerven Morrill LLP

(57) ABSTRACT

An ion implantation apparatus for integrated circuit manufacturing is disclosed. In an apparatus in accordance with an embodiment of the invention, a current detector detects a current flowing to a turbo pump. A display displays information about the detected current, and a controller determines whether the detected current is within a specified range. If the detected current is not within the specified range, the controller issues a power control signal to, stop the turbo pump. At this time, the controller also stops an ion implantation of the apparatus.

21 Claims, 6 Drawing Sheets

METHOD FOR MONITORING TURBO PUMP OPERATION IN AN ION IMPLANTATION APPARATUS

FIELD OF THE INVENTION

The present invention relates to an ion implantation apparatus for use in integrated circuit manufacturing, and more particularly to monitoring of a turbo pump in an ion implantation apparatus.

BACKGROUND OF THE INVENTION

An ion implantation apparatus for use in manufacturing integrated circuits introduces impurities into a silicon or gallium arsenide target by providing impurities to an ion source, extracting the impurities in the form of an ion beam, accelerating the ions to a desired energy, and directing the ion beam to implant the impurities in the target. The concentration of impurities introduced into the target can be precisely determined by measuring the current of the ion beam using a Faraday cup, where the dose is the total number of ions in the current.

For ion implantation, high energy implant processes that can freely control the impurity profile in the interior of silicon substrates are increasingly important. Thus, tandem acceleration principles, such as described in U.S. Pat. No. 3,353,107, which is hereby incorporated by reference in its entirety, are often used to accelerate ions to high energy and implant the ions in silicon substrates. Typical tandem acceleration techniques produce a negative ion beam by combining a positive ion source and a charge exchange cell, or by using a sputter type negative. ion source. The negative ion beam is directed toward an accelerator terminal that is at high positive terminal voltage and accelerated to the terminal voltage.

Then, electrons are stripped from this accelerated negative ion beam in the accelerator terminal by causing the beam to pass through a gas or thin foil that converts the beam into a positive ion beam. This positive ion beam is accelerated to ground potential from the high positive potential of the accelerator terminal and acquires its final energy.

U.S. Pat. No. 4,980,556 and U.S. Pat. No. 5,300,891, which are hereby incorporated by reference in their entirety, disclose examples of apparatuses using the tandem principle. One specific example is a Genus Inc. Model G1500 high energy ion implantation apparatus. FIG. 1 illustrates a known high energy ion implantation apparatus, which is the Model G1500 modified by omitting a pre-acceleration tube now used on the Model G1500. In this apparatus, a hot-cathode PIG (Penning Ion Gauge) ion source 1 produces positive ions. Applying a high positive voltage on ion source 1 extracts these positive ions as a beam. The extracted positive ion beam collides with magnesium vapor when passing through a charge exchange cell 2 which is encountered immediately after ion source 1, and some of the positive ions in the positive ion beam pick up two electrons from the magnesium, so that the positive ion beam becomes a negative ion beam.

After charge exchange cell 2, a pre-analyzing magnet 3 separates ions according to their charge-to-mass ratio so that only the negative ions having a desired energy are injected toward a tandem accelerator 6 which includes a low-energy acceleration tube 7, a stripper canal 8 and a high-energy acceleration tube 10.

A quadrupole magnetic lens 4 furnished at an entrance aperture part of a low-energy acceleration tube 7 of tandem accelerator 6 focuses the mass-analyzed negative ion beam and creates a beam waist. Then, a beam neutralizer (gas cell) 5 neutralizes the focused negative ion beam before entering accelerator 6 where the negative ion beam is accelerated.

When passing through stripper canal 8, the negative ion beam loses orbital electrons by colliding with nitrogen gas that is introduced into stripper canal 8 to convert the beam to a positive ion beam. Since the collision produces a great number of ions charged with various energy levels, accelerator 6 is grounded by a grounding rod 9 as to prevent charging of accelerator 6.

A post-quadrupole lens 11 further focuses the ion beam from high-energy acceleration tube 10, and a post-analyzing magnet 12 separates ions of the beam according to the charge to-mass ratios of the ions and introduces the beam into a process chamber 13 containing a target such as a silicon wafer.

FIG. 2 shows a basic construction of beam neutralizer 5. As shown in FIG. 2, beam neutralizer 5 is a gas cell that is in communication with a gas inlet 16, and a turbo molecular pump 14 which circulates the gas in the cell and creates a high vacuum state in a vacuum region of the ion implantation apparatus. Even if a large amount of gas such as $H_2$, $N_2$, $O_2$, etc. is introduced into the apparatus, differential pumping keeps the gas out of the vacuum region such as process chamber 13 (FIG. 1). Inside beam neutralizer 5, the negative ion beam collides with the gas and is neutralized.

Turbo pump 14 operates on a three-phase alternating current supplied from a power supply 15. However, the apparatus does not have a means for monitoring the operation of turbo pump 14 and cannot immediately detect abnormal operation of turbo pump 14. If turbo pump 14 does not operate properly, the ion beam is not neutralized and accelerated as required, and thus a serious process failure occurs. The abnormal operation can occur due to a malfunction of turbo pump 14, insufficient voltage from power supply 15 to turbo pump 14, or an overload of turbo pump 14.

SUMMARY OF THE INVENTION

According to an aspect of the present invention, an ion implantation apparatus for use in manufacturing integrated circuits includes a beam neutralizer for neutralizing an ion beam passing therethrough. The beam neutralizer has a turbo pump that circulates a neutralizing gas inside the beam neutralizer and provides a high vacuum state in a vacuum region of the apparatus. A power supply provides three-phase AC power to the turbo pump, and a current detector measures a current flowing to the turbo pump. A display device or screen displays information about the current. A main controller of the apparatus controls overall operation of the apparatus, and particularly, determines whether the measured current is within a specified range. If the current is not within the range, the main controller generates a power control signal, halts the ion implantation operation, and turns off the turbo pump.

Alternatively, the current detector can measure the current flowing to the turbo pump, determine whether the measured current is within a specified range, and generate the power control signal if the current is not within the range. A display device or screen displays information about the current. In response to the power control signal, the main controller of the apparatus controls can halt an ion implantation operation when the current is out of the desired range.

According to another aspect of the invention, a method for monitoring a turbo pump of an ion implantation apparatus includes measuring a current flowing to the turbo pump, determining whether the measured current is within a specified range, generating a power control signal if the current is not within the range, and stopping the power to the turbo pump in response to the power control signal. The method can further include displaying and storing information about the current respectively on a display and in a memory.

BRIEF DESCRIPTION OF THE DRAWINGS

This invention may be understood to those skilled in the art with reference to the accompanying drawings as follows.

Use of the same reference symbols in different figures indicates similar or identical items.

DETAILED DESCRIPTION OF THE PREFERRED EMBODIMENTS

Figure 1:
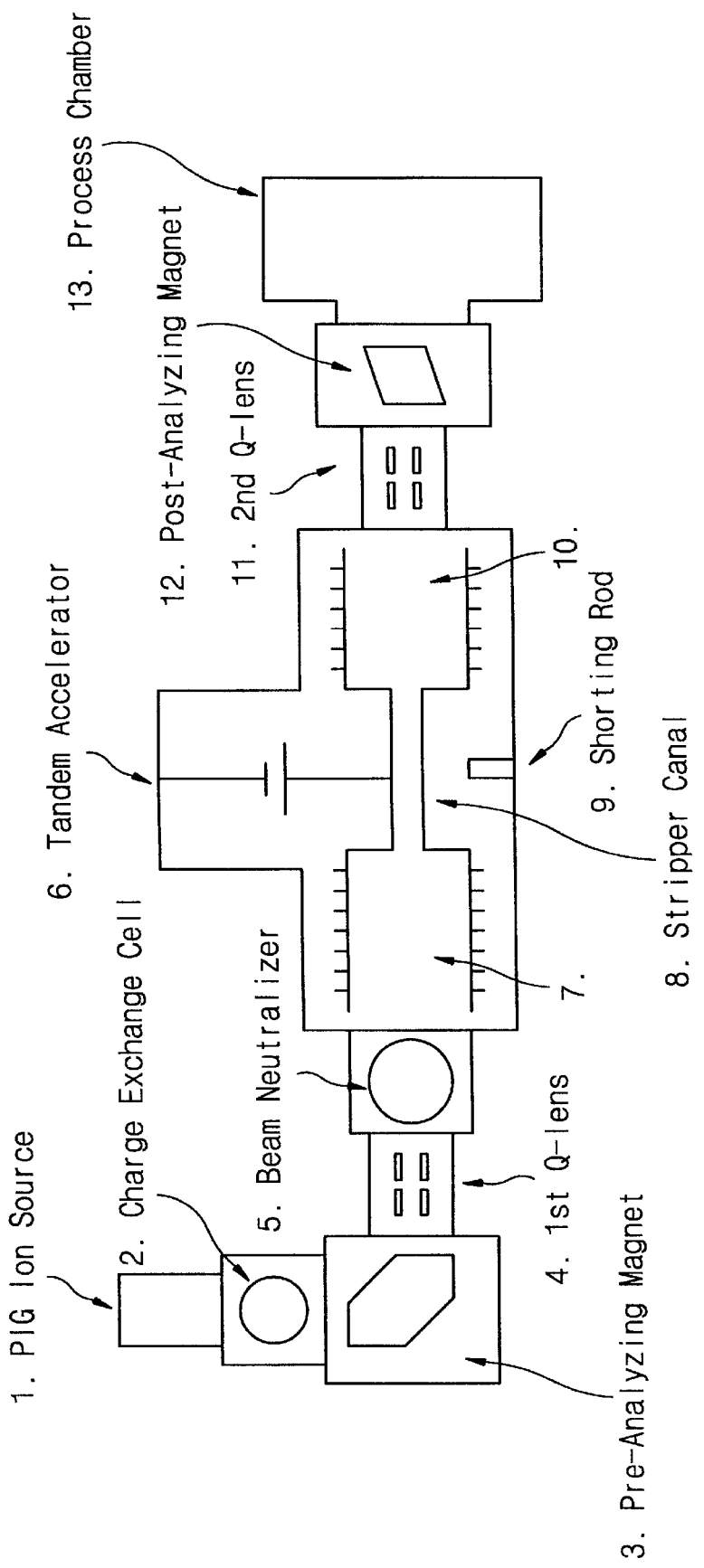
FIG. 1 is a block diagram of a known ion implantation apparatus.
Figure 2:
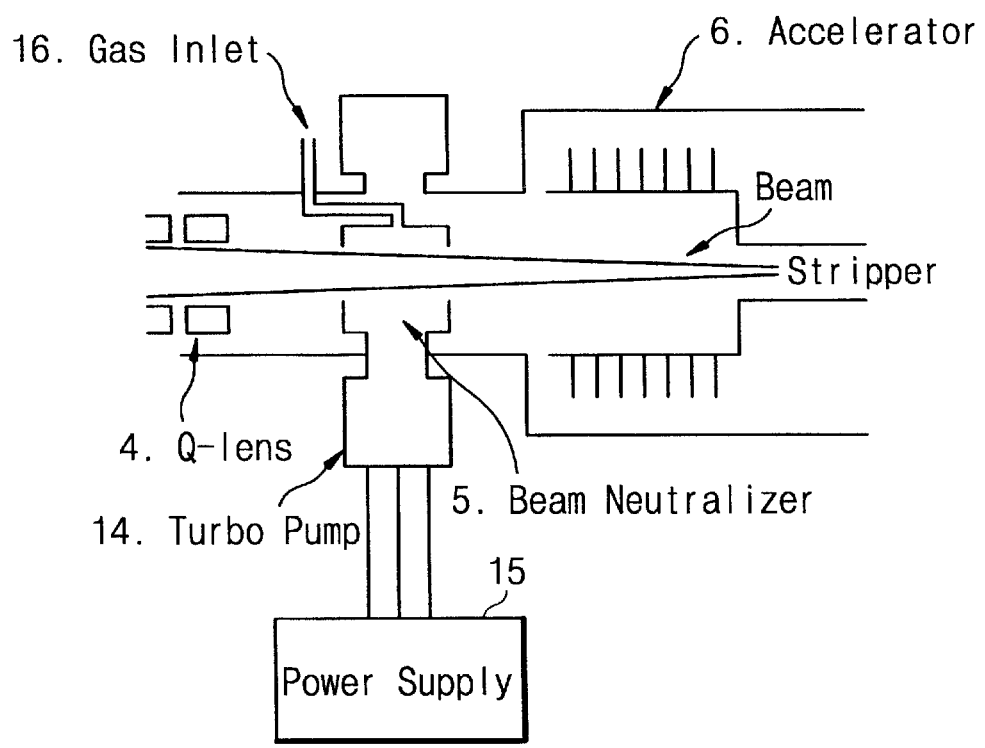
FIG. 2 is a block diagram around a beam neutralizer of the apparatus of FIG. 1.
Figure 3:
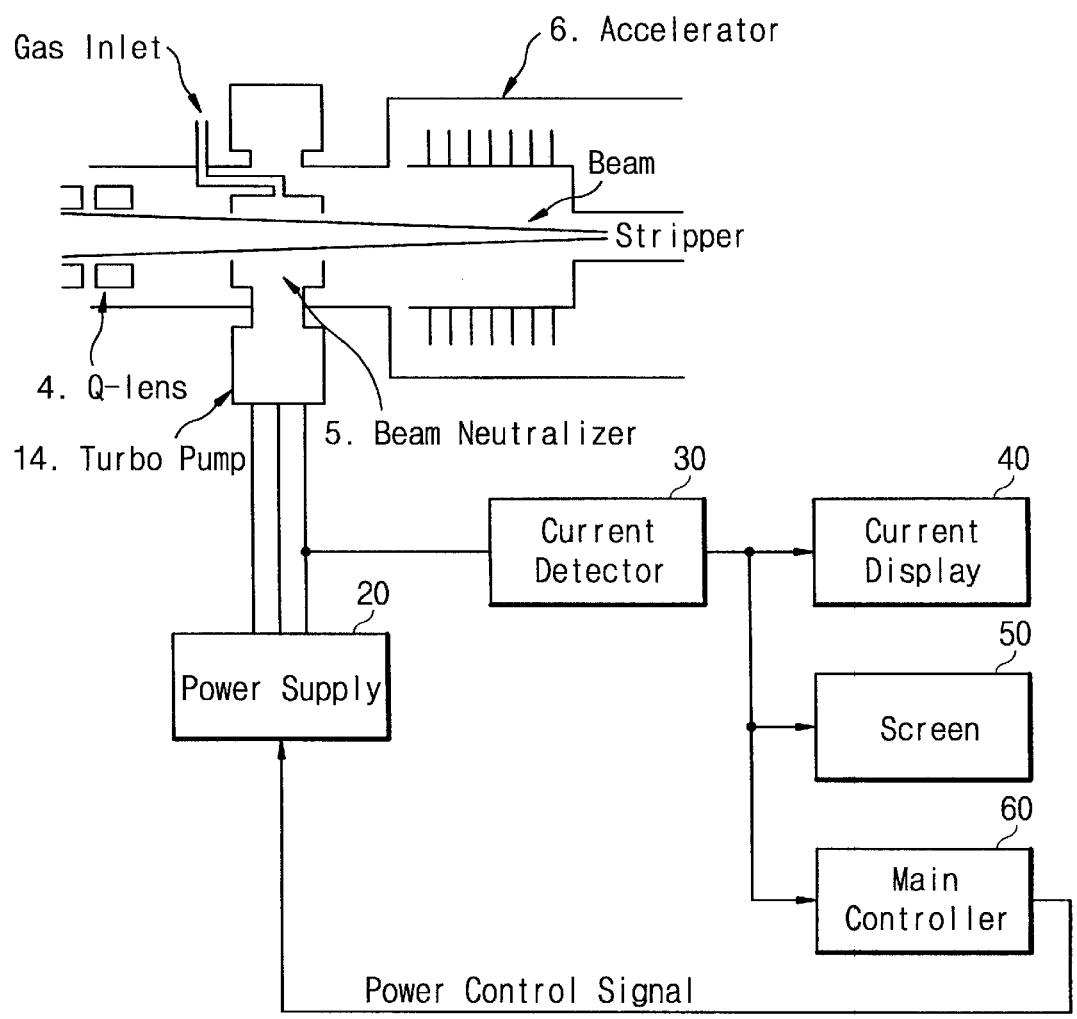
FIG. 3 is a block diagram of a circuit for monitoring an operation of a turbo pump of an ion implantation apparatus in accordance with an embodiment of the present invention.

FIG. 3 illustrates a system for monitoring an operation of a turbo pump 14 of an ion implantation apparatus in accordance with an embodiment of the present invention. The ion implantation apparatus has a main controller 60 for overall control of the apparatus. A power supply 20 supplies turbo pump 14 with a three-phase AC voltage through three power supply lines. A beam neutralizer 5, which is located between a pre-quadrupole lens 4 and a tandem accelerator 6, includes turbo pump 14. Beam neutralizer 5 is in the same accelerator assembly housing as tandem accelerator 6. A current detector 30 connects to one of the three power supply lines to measure a current flowing through the power supply line, and sends a signal corresponding to the current to main controller 60. The signal is also sent to a display device 40 and a screen 50 for display of information about the current. Current detector 30 may include a current detector winding (not shown) coupled to one of the three-phase power supply lines as a current sensor. The coupling between current detector 30 and the power supply line is typically an inductive coupling where changing magnetic flux surrounding the power supply line induces an AC voltage in the detector winding. The magnitude of the induced voltage in the detector winding is proportional to the magnitude of the current in the power supply line. An amplifier (not shown) can amplify a voltage induced in the current detector winding. The resulting voltage, which is proportional to the magnitude of current, is sent to main controller 60, which may include a control program to manage the overall control operation of the implantation apparatus. Main controller 60 determines whether the current is within a specified range. Alternatively, current detector 30 includes a current detector winding coupled to one of the three-phase power supply lines and an analyzer. The analyzer can generate an information signal and/or a control signal indicating the magnitude of the power supply current. The information signal and/or the control signal indicates whether the power supply current is outside of a specified range.

In the system of FIG. 3, main controller 60 controls an operation of turbo pump 14 by deciding whether the detected current is within a specified range and issuing a power control signal according to the decision. The specified range for the current that turbo pump 14 draws depends on the operating parameters of pump 14. In particular, a current being below a lower limit of the specified range indicates that the turbo pump is not operating either because a pump motor has an open winding or the load placed on the motor is below that expected for normal operation of the turbo pump. The current being too high, (i.e., being above an upper limit of the specified range) can indicate a short in the motor or a higher than expected load on the turbo pump. Either case indicates improper operation of pump 14 and improper gas pressures in the apparatus.

Figure 4:
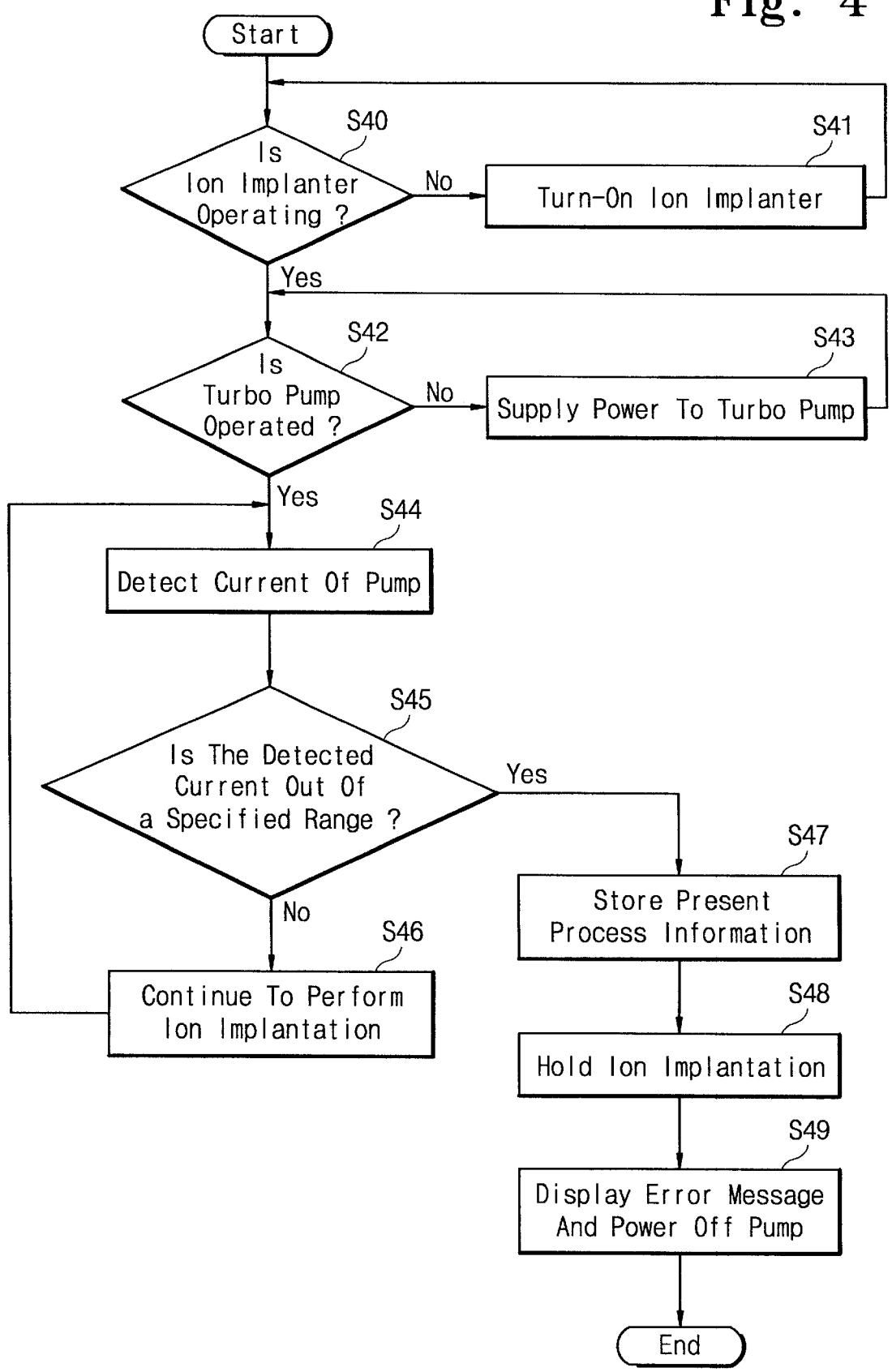
FIG. 4 is a flowchart of a method for monitoring the operation of the turbo pump of FIG. 3.

FIG. 4 illustrates a method for monitoring the operation of the turbo pump of FIG. 3. Initially, main controller 60 determines whether the apparatus is operating (step S40). If so, the main control moves to step S42, and if not, main control turns on the apparatus in step S41. At step S42, main controller 60 checks whether turbo pump 14 is operating. If turbo pump 14 is not operating, main controller 60 makes power supply 20 supply turbo pump 14 with three-phase power in a step S43. If the turbo pump is operating, current detector 30, in step S44, detects the current flowing through one of the three-phase power supply lines and sends an information signal corresponding to the detected current to current display device 40 and screen 50. Current display device 40 and screen 50 display information about the detected current. Current detector 30 also send the information signal to main controller 60.

After receiving the information signal, main controller 60, in step S45, determines whether the current is out of a specified range. If the current is in the specified range, the apparatus continues to operate (step S46) and periodically loops back to step S44 to check whether the current is still in the specified range. If the current is outside the specified range, main controller 60, in step S47, stores present process information in a memory and displays the information on screen 50. Then, main controller 60 halts the present ion implantation operation (step S48), displays an error message on screen 50 (step S49), and generates a power control signal. Turbo pump 14 is powered off in response to the power control signal because the power control signal keeps power supply 20 from supplying the power voltage to turbo pump 14. Herein, turbo pump 14 operates normally only when the detected current is within the specified range. That is, only current within the specified range can make turbo pump 14 operate normally. Although described to perform sequentially, steps S47 and S48 can perform in parallel.

Figure 5:
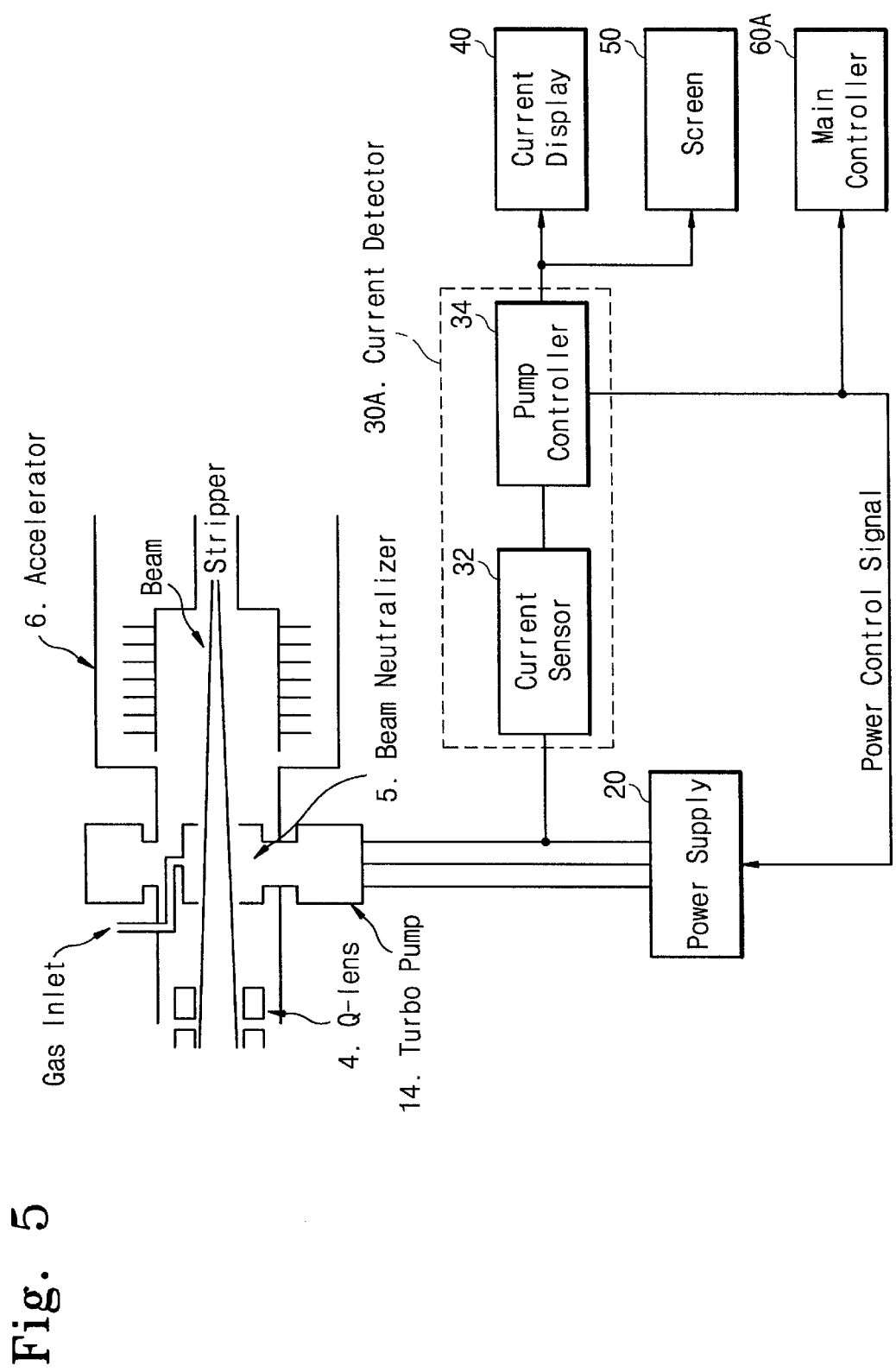
FIG. 5 is a circuit diagram for a circuit that monitors operation of a turbo pump in an ion implantation apparatus in accordance with another embodiment of the invention.

FIG. 5 illustrates a system for monitoring an operation of a turbo pump 14 of an ion implantation apparatus in accordance with another embodiment of the invention. The apparatus of FIG. 5 is similar to the apparatus of FIG. 3 except that a current detector 30A includes a pump controller 34 which issues the power control signal to turbo pump 14 instead of a main controller 60A issuing the power control signal. Current detector 30A, which corresponding to the detected current from current sensor 32 and determines whether the current is within a specified range. If the current is not within the specified range, pump controller 34 generates a power control signal and sends the signal to current display 40, screen 50, main controller 60A, and power supply 20. Upon receiving the power control signal indicating a current outside the specified range, power supply 20 switches off to turn off turbo pump 14. Current display device 40 and screen 50 display information about the detected current, and main controller 60A stops the apparatus operating.

Current sensor 32 typically includes a current detector winding (not shown) coupled to one of the three-phase power supply lines for sensing a current, and an amplifier (not shown) which amplifies a voltage induced in the current detector winding. The voltage, which is proportional to the amount of the current, is sent to pump controller 34, and pump controller 34 determines whether the current is within the specified range. Alternatively, current sensor 32 may include a current detector winding coupled to one of the three-phase power supply line, and a means such as an analog-to-digital converter for receiving a voltage induced in the current detector winding and generating an information signal corresponding to the induced voltage. In this embodiment, current detector 30A can control an operation of turbo pump 14 by deciding whether the detected current is within a specified range and issuing a power control signal according to the decision. Current detector 30A may include a control program executed by controller 34 for overall operation of current detector 30A.

Figure 6:
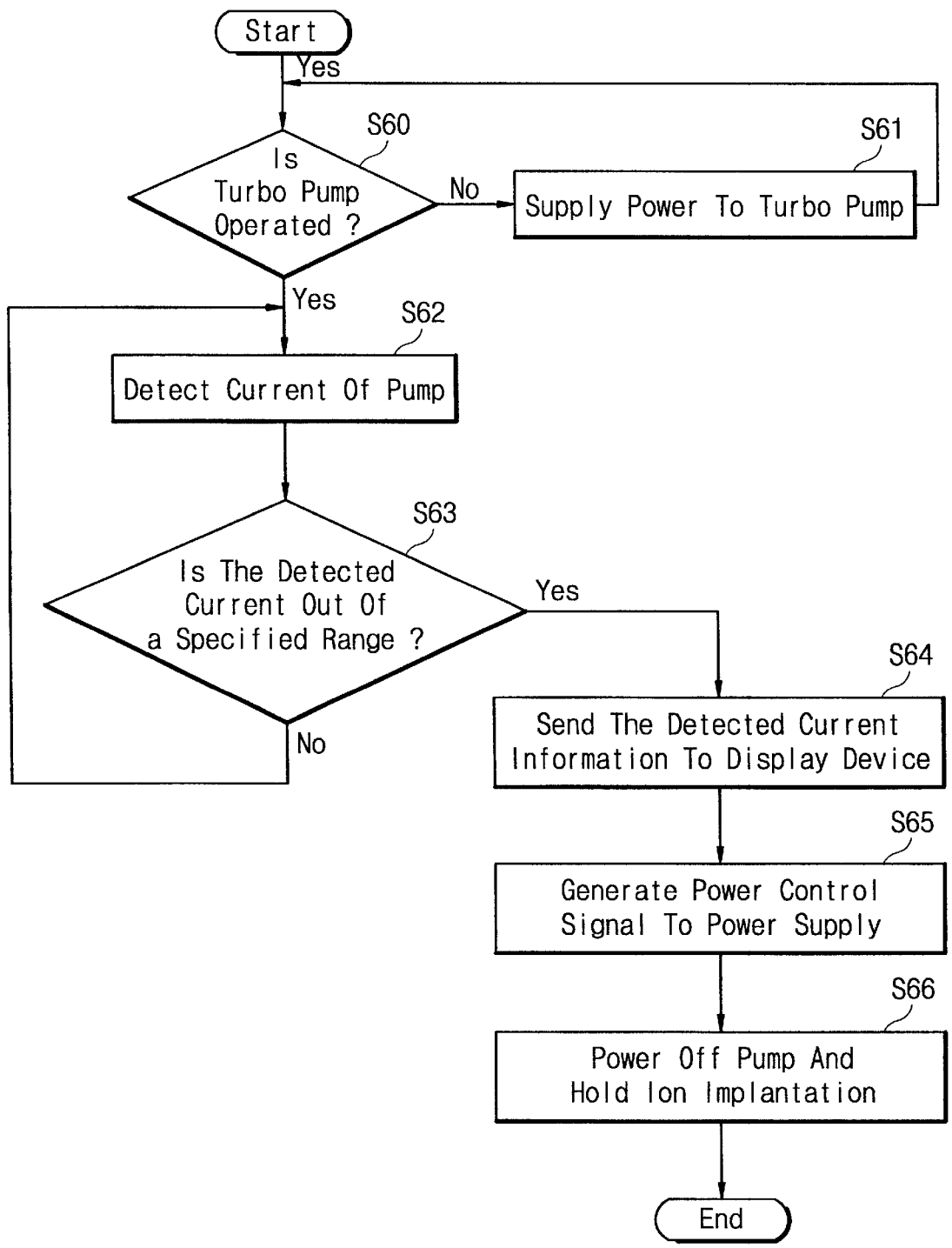
FIG. 6 is a flowchart of a method for monitoring the operation of the turbo pump of FIG. 5.

FIG. 6 illustrates a method for monitoring the operation of the turbo pump of FIG. 5. Initially, pump controller 34 checks whether turbo pump 14 is operating (step S60). If not, 10 current sensor 32 supplies turbo pump 14 with three-phase AC power by means of power supply 20 (step S61). If turbo pump 14 is operating, current sensor 32 detects a current flowing through one of the three power supply lines (step S62).

After the step S62, pump controller 34 determines whether the detected current is out of a specified range (step S63). If not, the system continues to operate and loops back to step S62. If the detected current is outside the specified range, pump controller 34 sends information about the detected current to current display device 40 and screen 50 for display data of the detected current (step S64). Pump controller 34 also sends a power control signal corresponding to the information to power supply 20 and main controller 60A (step S65). Upon receiving the power control signal, power supply 20 shuts off the power to turbo pump 14, and main controller 60A stores the information in a memory (not shown) therein and stops the implantation operation.

As described above, an ion implantation apparatus according to the invention can monitor whether the turbo pump is operating properly by detecting the current flowing through the three-phase power supply line that supplies power from the power supply to the turbo pump. When the current is not within a specified range, the apparatus stops ion implantation, and the turbo pump is powered off. Through the monitoring of the turbo pump, process failures can be detected or prevented.

Although the invention has been described with reference to particular embodiments, the description is an example of the invention's application and should not be taken as a limitation. Various and combinations of the features of the embodiments disclosed are within the scope of the invention as defined by the following claims.

What is claimed is:

1. An apparatus for implanting ions to a target, comprising:
   a beam neutralizer for neutralizing an ion beam passing therethrough;
   a pump for circulating a neutralizing gas through the beam neutralizer;
   a power supply for providing a power to the pump;
   a current detector for detecting and measuring a detected current flowing from the power supply to the pump; and
   a main controller for controlling overall functions of the apparatus and determining whether the detected current within a specified range, wherein if the current is not within the specified range, the main controller issues a power control signal to the power supply so that the power supply does not supply the power to the pump.

2. The apparatus according to claim 1, wherein the pump further provides a high vacuum state in a vacuum region of the apparatus.

3. The apparatus according to claim 1, wherein the power is three-phase power supplied through three power lines.

4. The apparatus according to claim 3, wherein the current detector couples to one of the three power lines.

5. The apparatus according to claim 1, further comprising a display for displaying information about the detected current.

6. The apparatus according to claim 1, wherein the main controller stops an ion implantation in response to the power control signal.

7. An apparatus for implanting ions to a substrate, comprising:
   a beam neutralizer for neutralizing an ion beam passing therethrough;
   a pump for circulating a neutralizing gas through the beam neutralizer;
   a power supply for providing a power to the pump;
   a current detector for detecting and measuring a current flowing from the power supply to the pump, and determining whether the current is within a specified range, wherein if the current is not within the specified range, the current detector issues a power control signal to the power supply so that the power supply does not supply the power to the pump; and
   a main controller for controlling overall functions of the apparatus.

8. The apparatus according to claim 7, wherein the pump further provides a high vacuum state in a vacuum region of the apparatus.

9. The apparatus according to claim 7, wherein the power is three-phase power supplied through three power lines.

10. The apparatus according to claim 9, wherein the current detector couples to one of the three power lines.

11. The apparatus according to claim 7, further comprising a display for displaying information about the detected current.

12. The apparatus according to claim 7, wherein the main controller stops an ion implantation in response to the power control signal.

13. The apparatus according to claim 7, wherein the current detector comprises a current sensor for detecting and measuring the current flowing from the power supply to the pump, and a pump controller for determining whether the current is within the specified range and issuing the power control signal if the current is not within the specified range.

14. A method for monitoring a pump in an ion implantation apparatus, wherein a power supply supplies a power to the pump, the method comprising:
   detecting and measuring a current flowing to the pump;
   determining whether the detected current is within a specified range;

generating a power control signal, if the current is not within the specified range; and making the power supply stop supplying the power to the pump in response to the power control signal.

15. The method according to claim 14, further comprising displaying and storing information about the detected current on a display and in a memory respectively.

16. The method according to claim 14, wherein the power is three-phase power supplied through three power lines.

17. The method according to claim 16, wherein the detecting and measuring step measures the current flowing in one of the three power lines.

18. The method according to claim 14, further comprising stopping ion implanting of the apparatus in response to the power control signal.

19. An apparatus for implanting ions to a target, comprising:

a beam neutralizer for neutralizing an ion beam passing therethrough;

a pump for circulating a neutralizing gas through the beam neutralizer;

a power supply for providing a power to the pump;

a current detector for detecting and measuring a detected current flowing from the power supply to the pump;

a main controller for controlling overall functions of the apparatus and determining whether the detected current is within a specified range, wherein if the current is not within the specified range, the main controller issues a power control signal to the power supply so that the power supply does not supply the power to the pump, and further wherein the main controller stops an ion implantation in response to the power control signal; and a display for displaying information about the detected current.

20. An apparatus for implanting ions to a substrate, comprising:

a beam neutralizer for neutralizing an ion beam passing therethrough;

a pump for circulating a neutralizing gas through the beam neutralizer;

a power supply for providing a power to the pump;

a current detector for detecting and measuring a current flowing from the power supply to the pump, and determining whether the current is within a specified range, wherein if the current is not within the specified range, the current detector issues a power control signal to the power supply so that the power supply does not supply the power to the pump;

a main controller for controlling overall functions of the apparatus wherein the main controller stops an ion implantation in response to the power control signal; and a display for displaying information about the detected current.

21. A method for monitoring a pump in an ion implantation apparatus, wherein a power supply supplies a power to the pump, the method comprising:

detecting and measuring a current flowing to the pump;

determining whether the detected current is within a specified range;

generating a power control signal, if the current is not within the specified range;

turning the power supply supplying the power to the pump off in response to the power control signal and stopping ion implanting of the apparatus in response to the power control signal; and displaying and storing information about the detected current on a display and in a memory respectively.

* * * * *